(12) United States Patent
Hoefler et al.

(10) Patent No.: US 7,285,832 B2
(45) Date of Patent: Oct. 23, 2007

(54) MULTIPORT SINGLE TRANSISTOR BIT CELL

(76) Inventors: Alexander B. Hoefler, 2503 Bridle Path, Apt. E, Austin, TX (US) 78703; James D. Burnett, 3804 Laurel Ledge La., Austin, TX (US) 78731

( * ) Notice: Subject to any disclaimer, the term of this patent is extended or adjusted under 35 U.S.C. 154(b) by 195 days.

(21) Appl. No.: 11/192,956

(22) Filed: Jul. 29, 2005

(65) Prior Publication Data

US 2007/0023789 A1    Feb. 1, 2007

(51) Int. Cl.
*H01L 29/94* (2006.01)
(52) U.S. Cl. .................. 257/393; 257/401; 257/903; 257/E27.098; 365/230.05
(58) Field of Classification Search ............... 257/393
See application file for complete search history.

(56) References Cited

U.S. PATENT DOCUMENTS

| | | | |
|---|---|---|---|
| 5,939,740 A * | 8/1999 | Hashimoto et al. | ......... 257/213 |
| 6,613,615 B2 | 9/2003 | Mandelman et al. | |
| 6,714,436 B1 | 3/2004 | Burnett et al. | |
| 6,781,875 B2 | 8/2004 | Ohsawa | |

OTHER PUBLICATIONS

Sakurai et al., Transparent-Refresh DRAM (TReD) Using Dual-Port DRAM Cell, IEEE 1988 CICC; pp. 4.3.1-4.3.4.
Okhonin et al., A Capacitor-Less 1T-DRAM Cell, IEEE EDL, vol. 23, No. 2, Feb. 2002.

* cited by examiner

*Primary Examiner*—Tu-Tu Ho
(74) *Attorney, Agent, or Firm*—James L. Clingan, Jr.

(57) ABSTRACT

A multiport memory cell (200, 300, 600) includes a first word line (WL1) coupled to a gate electrode of a first transistor (201, 301, 601). A second word line (WL2) is coupled to a gate electrode of a second transistor (202, 302, 602). Importantly, the memory cell (200, 300, 600) includes a conductive path (215, 315) between an electrically floating body (426) of the first transistor (201) and an electrically floating body (426) of the second transistor (202). The first word line (WL1) may overlie a first portion of a common body (426) and the second word line (WL2) may overlie a second portion of the common body (426). The common body (426) may be positioned vertically between a buried oxide layer (427) and a gate dielectric layer (430) and laterally between first and second source/drain regions (401, 407) formed in a semiconductor layer (425). The cell (200, 300, 600) may include a third transistor (603) including a third word line (613) where the shared transistor body (610) is shared with the third transistor (603) and wherein the conductive path is connected to the third transistor (603).

16 Claims, 3 Drawing Sheets

MULTIPORT SINGLE TRANSISTOR BIT CELL

FIELD OF THE INVENTION

The invention is in the field of integrated circuits and more specifically, multiple port memory devices.

RELATED ART

Multiple port (multiport) memory cells are known in the field of integrated circuit devices. Referring to FIG. 1, a conventional multiport cell 100 is depicted. Cell 100 uses a conventional six transistor (6T) design that will be familiar to those knowledgeable in the design of static random access memory (SRAM) devices. Specifically, cell 100 includes a pair of cross coupled CMOS inverters including PMOS transistors 101 and 102 and NMOS transistors 103 and 104. NMOS pass transistors 105-1 and 106-1 connect the inverter outputs to a first bit line (BL1) and its inverse (BLB1). A first word line-WL drives pass transistors 105-1 and 105-2.

Dual port functionality is achieved in cell 100 by the inclusion of an additional pair of pass transistors 105-2 and 106-2, and additional bit line pair (BL2 and BLB2), and an additional word line (WL2). Additional "ports" can be added to cell 100 by adding an additional pair of pass transistors 105-n and 106-n (not depicted) and the corresponding word line and bit line pairs.

This traditional cell suffers a significant drawback in terms of its size. Specifically, each cell 100 requires a minimum of six transistors for a single port application and, for every additional port, two additional transistors and the accompanying interconnects. The number of transistors required by cell 100 limits the minimum area required to implement the cell in silicon. Because denser (smaller) circuits are generally preferable to less dense (larger) circuits, it would be desirable to implement a multiport cell requiring less area than the conventional 6T cell.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a multiport memory cell uses a one-transistor, capacitorless (1T/0C) memory cell technology. The memory cell includes two or more 1T/0C memory cells that share a common transistor "body." The body is positioned above a buried dielectric such that the body is electrically floating. In other cases, an electrically floating body can also be achieved with a buried layer of semiconductor with a conductivity type that is different from the conductivity type of the semiconductor surface region. Each of the transistors in the multiport cell includes its own word line and bit line pair. The multiport cell is configured to permit independent reading of each port in the cell. The cell design enables simultaneous programming and erasing of the entire cell since the floating body, which is shared by the transistors in the cell, is shared between or among each of the transistors in the cell.

Figure 2:
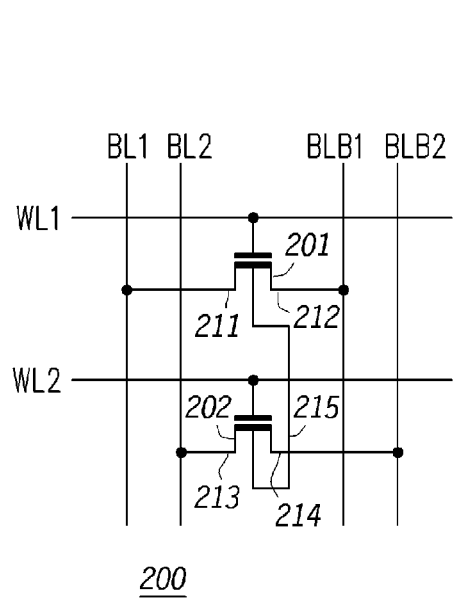
FIG. 2 is a circuit diagram of a dual port memory cell according to the present invention.

Referring now to FIG. 2, a circuit diagram of an embodiment of a dual port memory cell 200 is presented. In the depicted embodiment, dual port memory cell 200 includes a first transistor 201 and a second transistor 202 where transistors 201 and 202 are of the same conductivity type (NMOS in the depicted embodiment). A first word line WL1 is coupled to a gate electrode of first transistor 201 while a second word line WL2 is coupled to a gate electrode of the second transistor 202. First transistor 201 is connected to a first bit line pair, which includes a first bit line BL1 and a first bit line bar (BLB1). Second transistor 202 is connected to a second bit line pair, which includes a second bit line BL2 and a second bit line bar (BLB2). First bit line BL1 is connected to a first source terminal 211 while first bit line bar BLB1 is connected to a first drain terminal 212 of first transistor 201. Similarly, second bit line BL2 is connected to a second source terminal 213 while second bit line bar BLB2 is connected to a second drain terminal 214 of second transistor 202. In this embodiment, the bit line pair for transistor 201 is independent of the bit line pair for transistor 202. Similarly, first and second word lines WL1 and WL2 are preferably independent word lines such that either can be biased with respect to the other.

Like all transistors, transistors 201 and 202 include transistor bodies in addition to source, drain, and gate electrodes. The transistor bodies are of particular interest in the family of 1T/0C memory cells, of which memory cell 200 is a member. Although there is no external connection to the bodies of transistors 201 and 202, the bodies are capable of altering transistor behavior. More specifically, the amount of stored charge residing in the transistor body affects the electrical properties of the transistor.

For purposes of this disclosure, the transistor body refers to a portion of a transistor that is capacitively coupled to the gate electrode and in which a conductive channel is formed upon application of a threshold voltage to the gate electrode. In a planar transistor implementation, the transistor body includes the portion of the substrate underlying the gate electrode and any region of the substrate conductively coupled thereto. As an example, if the substrate underlying the gate electrode of a transistor is lightly doped with a p-type impurity, the transistor body would include the entire p-type region including portions (if any) of the p-type region not underlying the gate electrode.

In conventional planar transistors, the transistor body (as that term is being used herein) is located exclusively under the gate electrode because the gate electrode is used as a source/drain implant mask. In the present application, however, the transistor body region may extend to regions of the substrate not underlying the gate electrode such as by preventing the source/drain implant from penetrating areas of the substrate that do not lie under the gate electrode. As another example, the transistor body might extend beyond the portion underlying the gate electrode by an additional implant that restores the conductivity of at least some portions of the substrate to the conductivity of the substrate portion underlying the gate electrode.

The bodies of first and second transistors 201 and 202 are, as described in greater detail below, electrically floating structures (e.g., there is no conductive path from the transistor bodies to a static voltage such as ground or VDD) or to a terminal of the transistor. As such, each transistor is capable of programming or storing charge in the floating body by biasing the transistor terminals with an appropriate bias. Programming of a 1T/0C memory cell can be done using an impact ionization mechanism (e.g., $V_G$=0.6 V, $V_D$=1.8 V, and $V_S$=0 V) or tunneling ($V_G$=-1.8 V, $V_D$=1.8 V, and $V_S$=0 V), with $V_G$, $V_D$, and $V_S$ denoting the gate, drain, and source bias with respect to a reference voltage, e.g., a grounded reference.

Stored charge in the transistor body alters the threshold voltage of the transistor and is, therefore, capable of being sensed by sensing circuitry. A "programmed" transistor will have a first threshold voltage while a non-programmed or "erased" transistor will have a second threshold voltage. Application of a fixed voltage to the transistor gate electrode (through the corresponding word line) will produce different levels of drain current depending upon the transistor's threshold voltage. Accordingly, sensing circuitry can distinguish a programmed transistor from an erased transistor thereby forming the basis for a storage cell or a memory bit.

Importantly, dual port memory cell 200 includes an electrically conductive path 215 between a body of first transistor 201 and a body of second transistor 202. Conductive path 215 enables multiport functionality by tying the programmed state of one transistor in the multiport cell to the programmed state of the other transistor in the cell. When first transistor 201 is programmed, excess charge is generated in the transistor body. Because the transistor body of first transistor 201 is conductively coupled to the transistor body of second transistor 202, the amount of excess charge in the transistor body has an equal impact on the threshold voltage of first and second transistors 201 and 202. Accordingly, dual port memory cell 200 represents a single bit of information that may be programmed, erased, or read using two different ports or paths.

Figure 3:
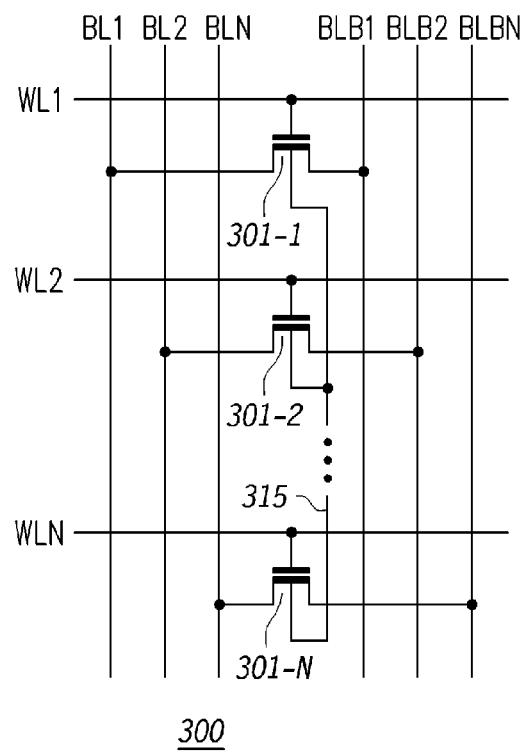
FIG. 3 is a multiport version of the dual port memory cell of FIG. 2.

Referring now to FIG. 3, the dual port memory cell 200 of FIG. 2 is expanded to produce a multiport memory cell (multiport cell) 300. Multiport cell 300 is architecturally analogous to dual port cell 200, but, instead of having two transistors sharing a common transistor body, multiport cell 300 includes "n" transistors. Thus, multiport cell 300 includes transistors 301-1 through 301-n (generically or collectively referred to as transistor(s) 301). Each transistor 301 has a gate terminal connected to a corresponding word line (WL1, WL2, . . . WLn), a source/drain terminal connected to a bit line (BL1, BL2, and BLn), and another source/drain terminal connected to a bit line bar (BLB1, BLB2, and BLBn). A conductive path 315 is connected to a body of each transistor 301-1 through 301-n. In the depicted embodiment, each transistor 301 is an NMOS transistor.

Figure 1:
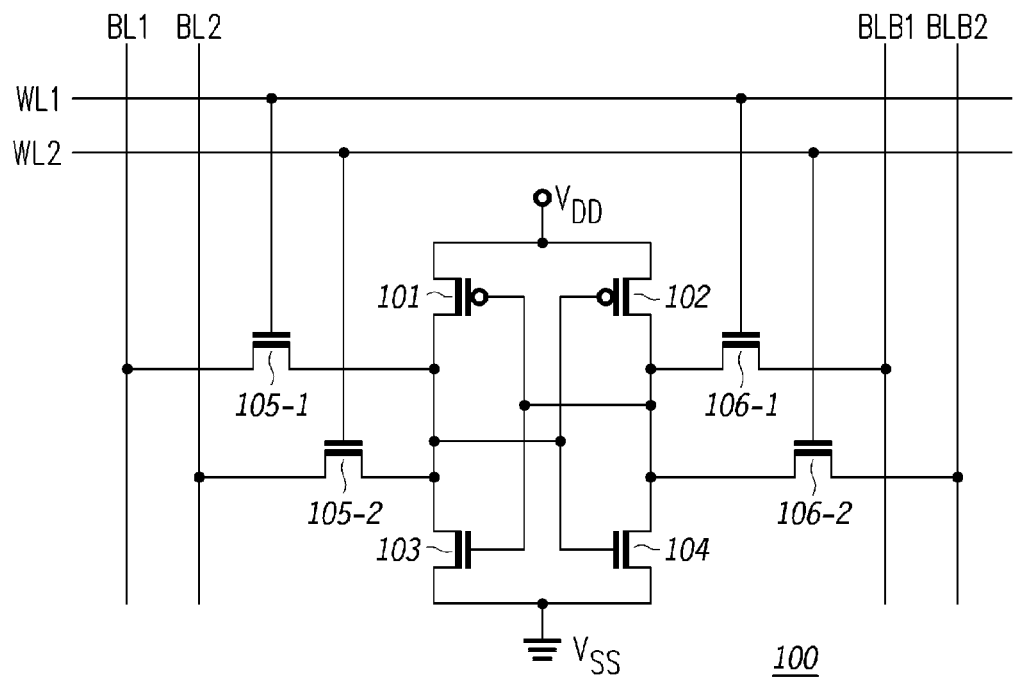
FIG. 1 is a circuit diagram of a conventional multiport memory cell based on a six transistor cell design according to the prior art.

Multiport cell 300 enables "n" different resources to access simultaneously the bit stored in the cell via independent word lines WL1 through WLn. In comparison to a multiport version of the 6T memory cell depicted in FIG. 1, it will be appreciated that multiport cell 300 achieves an n-port memory cell using n transistors whereas a generalized n-port memory cell based on the 6T design of cell 100 would require 4+2n transistors. From the perspective of area or density, multiport cell 300 is clearly superior to 6T multiport cell of the same "dimension" (i.e., having the same number of ports).

Figure 4:
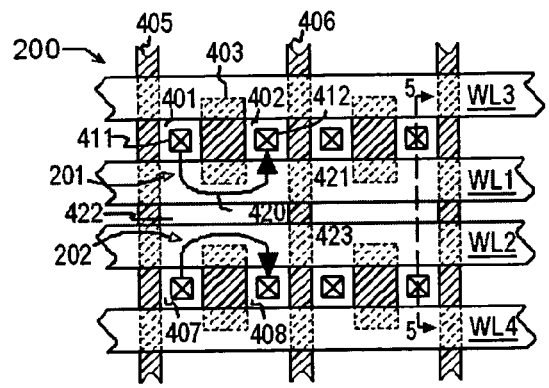
FIG. 4 is a top view of a layout of the circuit of FIG. 2 according to one embodiment of the invention.
Figure 5:
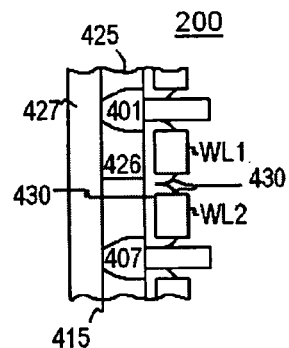
FIG. 5 is a partial cross section view taken along the line 5-5 of FIG. 4.

Turning now to FIG. 4 and FIG. 5, a top view and cross sectional view of an exemplary layout suitable for implementing one embodiment of dual port memory cell 200 depicted in FIG. 2 are shown. In FIG. 4, memory cell 200 includes two transistors (201 and 202) that share a common transistor body 426. Transistor 201 includes a first word line (WL1), which is likely implemented with polysilicon, that serves as the gate electrode for transistor 201. In other implementations, WL1 might be implemented in a metal layer that is connected to a gate of transistor 201 through a series of contacts and interconnects. In either implementation, WL1 is coupled to the gate electrode of first transistor 201.

Transistor 201 includes a first source/drain region 401 and a second source/drain region 402, which are contacted by corresponding bit lines using contacts 411 and 412. (The bit line metalization is omitted in FIG. 4 for the sake of clarity).

The boundaries of first source/drain region 401 are defined by WL1, WL3, isolation structure 405 and isolation structure 403. Isolation structure 403 may be a conventional shallow trench isolation (STI) structure. In other embodiments, however, isolation structure 403 represents an area where the source/drain implant used to form source/drain regions 401 and 402 is blocked by conventional masking techniques. In these embodiments, isolation structure 403 is not a dielectric (as in the case of STI structures). Instead, isolation structure 403 is a part of the semiconductor substrate having a conductivity type opposite the conductivity type of source/drain regions 401 and 402. If source/drain regions 401 and 402 are n+ regions, for example, isolation structure 403 would most likely be a lightly doped p (p−) region of the substrate. Isolation between source/drain regions 401 and 402 in this case would be maintained by the presence of back-to-back pn junctions. This type of isolation should be distinguished from the transistor channel in a conventional transistor. Although the conventional transistor channel is a semiconductor having a conductivity type opposite of the conductivity type of the source/drain regions, the conductivity type of a conventional transistor channel is electrically alterable by applying an appropriate bias to an overlying gate electrode. As depicted in FIG. 4, where there is no gate electrode overlying the portion of isolation structure 403 between source/drain regions 401 and 402, the conductivity type of the isolation structure is not affected by application of a gate electrode bias. In still another embodiment, isolation structure 403 represents an area in which a gate electrode spacer layer is protected from a subsequent spacer etch using a photoresist mask or the like.

Because isolation structure 403 is disposed between source/drain regions 401 and 402 of transistor 201, a conductive path (indicated by reference numeral 420) from source/drain region 401 to 402 must circumvent isolation region 403. Conductive path 420 is formed by biasing word line WL1, which serves as transistor gate electrode for transistor 201 and which is laterally displaced with respect to a straight line drawn between source/drain regions 401 and 402. This transistor configuration, in which the gate electrode is located along side the source/drain regions rather than traversing the source/drain active region as in conventional transistors, supports conventional transistor operation, but also facilitates the "maskless" formation of a shared transistor body that serves as the conductive path 215 depicted in FIG. 2.

WL1 is laterally displaced from and runs parallel to a second word line (WL2), which serves as the gate electrode for second transistor 202. A narrow gap 422 exists between the two gate electrodes. In one embodiment, the gap 422 is so narrow that spacers formed on opposing side walls of word lines WL1 and WL2 converge to form a "spacer mask" that covers the entire gap 422 and thereby prevents a subsequent source/drain implant from doping the portion of the semiconductor substrate underlying gap 422. Referring to the cross section of FIG. 5, spacers 430 formed on the interior sidewalls of WL1 and WL2 form a mask overlying a body portion 426 of a semiconductor layer 425 of a wafer substrate 415.

Figure 6:
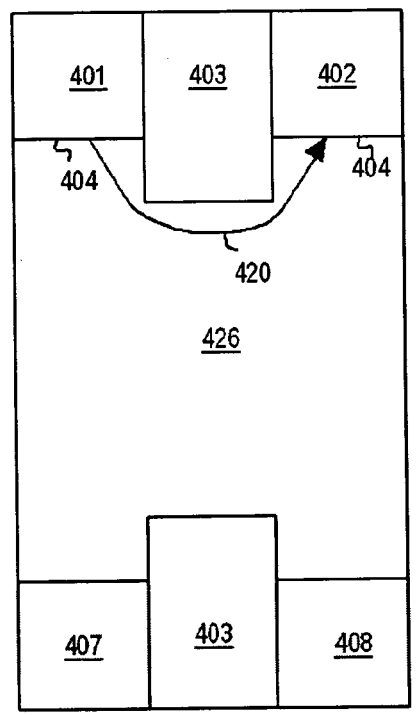
FIG. 6 is a top view of a portion of the memory cell of FIG. 4 with the word lines of FIG. 4 removed to emphasize the configuration of the body portion, the source/drain regions, and the isolation structure.

Referring to FIG. 6, a top view of a portion of the memory cell 200 of FIG. 4 is depicted with the word lines WL1 and WL2 removed. The portion of memory cell 200 depicted in FIG. 6 is the portion bounded in FIG. 4 by WL3, WL4, isolation structure 405, and isolation structure 406. As emphasized in FIG. 6, body portion 426 is a contiguous region that underlies gate electrode WL1 of first transistor 401 and gate electrode WL2 of second transistor 402. Body portion 426 as shown is adjacent to source/drain regions 401 and 402 and to the isolation structure 403 located between source/drain regions 401 and 402. The gate electrode WL1 of FIG. 4 overlies body portion 426. Because WL1 (in addition to other structures) masks a subsequent source/drain implant, an edge of WL1 defines the boundary 404 between source/drain regions 401 and 402 and body portion 426. Thus, gate electrode WL1 of first transistor 401, unlike the gate electrode of conventional transistors, WL1 does not traverse the region between the transistor's source/drain regions. Instead, gate electrode WL1 lies over a body portion that is laterally adjacent to the region between the transistor's source and drain regions. In an NMOS embodiment, source/drain regions 401, 402 are p-doped regions and body portion 426 is a p-doped region. Biasing the word line in this configuration creates a conductive path 420 between source/drain regions 401 and 402 that goes through body portion 426 around isolation structure 403.

As seen in FIG. 5, body portion 426 is located intermediate between source/drain regions 401 and 407 and vertically located intermediate between a gate dielectric 430 and a buried oxide (BOX) layer 427, which is characteristic of a semiconductor on insulator (SOI) wafer. Thus, body portion 426 is an electrically floating structure suitable for use in a 1T/0C memory cell. Because body portion 426 in this configuration is shared between two independently accessible transistors, a dual port cell is realized in which programming the transistor (creating excess charge in body portion 426) or erasing the transistor (removing excess charge in body portion 426) by either transistor alters the electrical characteristics of both transistors since the threshold voltage of both transistors is a function of the amount of charge in body portion 426.

Accordingly, body portion 426 of semiconductor layer 425 represents a transistor body shared by first and second transistors 401 and 402. The shared body portion 426 in this case underlies the region defined by reference numerals 421, 422, and 423, where reference numeral 421 refers to the portion of WL1 between isolation structures 405 and 406, reference numeral 422 refers to the gap between WL1 and WL2, and reference numeral 423 refers to the portion of WL2 between isolation structures 405 and 406. Transistor 202 is a mirror image of transistor 201 with a conductive path being formed from first source/drain region 407 to second source/drain region 408 when WL2 is asserted.

Figure 11:
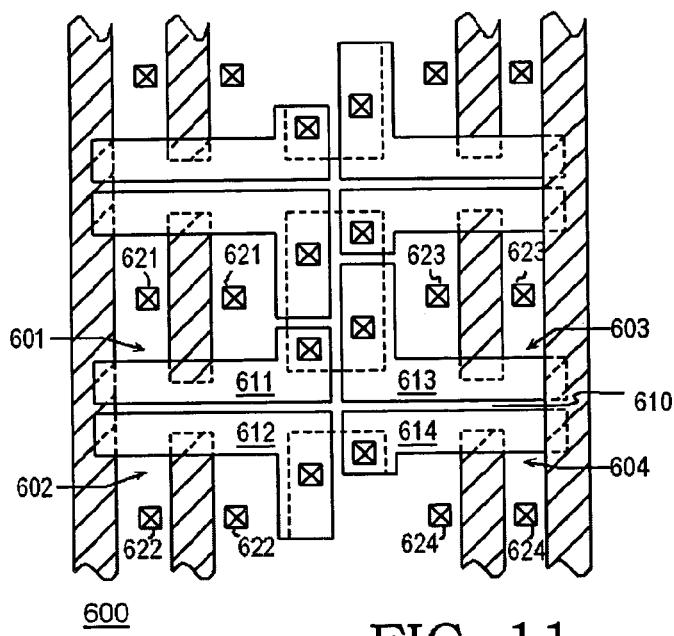
FIG. 11 is a top view of a layout of a multiport circuit according to one embodiment of the present invention.

Referring now to FIG. 11, a multiport cell 600 is shown for a 4-port embodiment. In this embodiment, cell 600 includes four transistors 601 through 604, each of which includes a corresponding gate electrode (word line) 611 through 614 and a pair of source/drain contacts (621 through 624). In the depicted embodiment, the gate electrodes 611 through 614 share a common transistor body 610 that underlies gate electrodes 611 through 614 and the gap formed by the closely space edges of the gate electrodes. The close spacing of gate electrodes 611 through 614 causes spacers formed on the gate electrode sidewalls to block a subsequent implant in the same manner as described above in FIG. 4 and FIG. 5 with respect to the dual port memory cell. Multiport cell 600 may be further expanding to include additional transistors as well.

Figure 7:
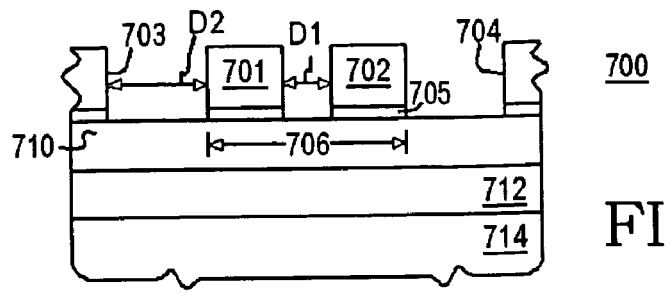
FIG. 7 is a partial cross section view of a wafer at an intermediate stage in the fabrication of a transistor according to the invention.

Referring to the partial cross sectional views of FIG. 7 through FIG. 10 (taken along the cross sectional line 5-5 of FIG. 4), one embodiment of a method 700 of fabricating a dual port memory cell such as dual port memory cell 200 of FIG. 4 and FIG. 5 is depicted. In the depicted embodiment, a set of word lines 701 through 704 are formed over a semiconductor layer 710. Semiconductor layer 710 lies over a buried isolation layer 712. Buried isolation layer 712 may be a dielectric (e.g., a silicon oxide BOX layer) or a semiconductor (e.g., a silicon layer having a conductivity type opposite the conductivity type of layer 710). Buried isolation layer 712 lies over a wafer bulk 714, preferably comprised of a lightly doped semiconductor such as silicon. Each word line 701 through 704 serves as a gate electrode for at least one corresponding transistor. Word lines 701 and 702 as depicted in FIG. 7 are closely spaced while word lines 701 and 703 (or 702 and 704) are distally spaced. The transistors corresponding to closely spaced word lines 701 and 702 will share a body portion as described in greater detail below.

Each word line 701 through 704 is a conductive material (e.g., polysilicon) patterned over a gate dielectric (e.g., silicon dioxide) 705. In other embodiments, alternative gate materials (e.g., TiN, TaSiN) may be used for word lines 701 through 704. Similarly, alternative gate dielectrics (e.g., high k materials such as $HfO_2$) may be used for gate dielectric 705.

In the dual port memory cell 200 of FIG. 4, two transistor share access to and control programming and erasing of a common charge storage element. As depicted in FIG. 7, the transistors that share a common storage element are represented by word lines 701 and 702 (which are analogous to word lines WL1 and WL2 in FIG. 4), which share access to a portion 706 of semiconductor layer 710. Portion 706 of semiconductor layer is referred to herein as a body portion 706 or simply body 706 of the corresponding transistors. In this embodiment, body 706 may be accessed using either the first word line 701 or the second word line 702.

As depicted in FIG. 7, the lateral separation (D1) between first and second word lines 701 and 702 is less than the lateral separation (D2) between word line 701 and a neighboring word line 703 (with which first word line 701 does not share a storage element). By placing first and second word lines 701 and 702 in close proximity to each other, the depicted embodiment of method 700 is beneficially able to mask body portion 706 from a subsequent implant (described below) without requiring an additional photolithography step. Masking this implant is required to maintain electrical continuity through body portion 706.

Figure 8:
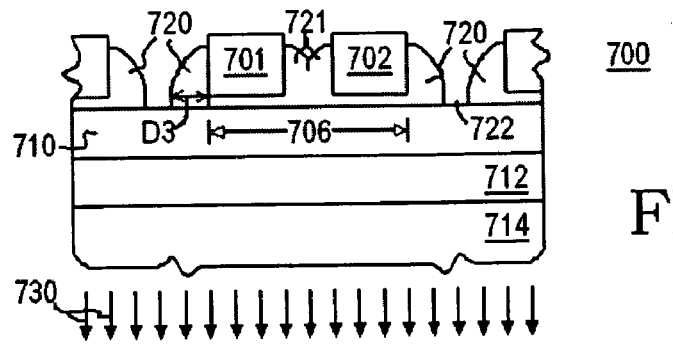
FIG. 8 depicts processing subsequent to FIG. 7 in which spacers are formed on sidewalls of word line gate electrodes emphasizing the convergence of spacers between closely spaced word lines.

In FIG. 8, spacers 720 are formed on sidewalls of word lines 701 through 704 using conventional spacer processing in which a conformal dielectric layer such as silicon nitride, silicon oxide or both are deposited over the wafer and subsequently etched anisotropically. The width (D3) of spacers 720 is controlled so that the spacer formation process results in the formation of a spacer mask 721 between closely spaced first and second word lines 701 and 702 where their respective spacers converge. Specifically, the width D3 of spacers 720 is greater half than the separation D1 between word lines 701 and 702 (i.e., D3>D1*0.5). In addition, the distance D2 between first word line 701 and distally spaced word line 703 is greater than twice the width D3 of spacers 720 (i.e., D2>2*D3) so that the formation of spacers 720 results in a gap 722 between spacers that exposes an upper surface of semiconductor layer 710.

Figure 9:
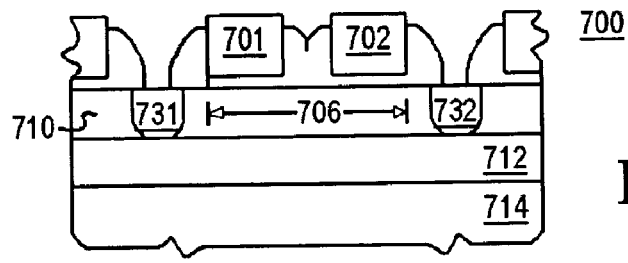
FIG. 9 depicts processing subsequent to FIG. 8 in which a source/drain implant is performed to form source/drain regions in the semiconductor layer emphasizing the blocking of the implant in the region between the closely spaced word line gate electrodes.

Referring to FIG. 9, a source/drain implant 730 is performed to create source/drain regions 731 and 732 in semiconductor layer 710. In an NMOS implementation, body portion 706 is a p-doped region and source/drain regions 731 and 732 are n-doped. Application of appropriate bias to word line 701 (positive bias in the NMOS embodiment) will create a conductive path between source/drain region 731 and a companion source/drain region not viewable in the cross section of FIG. 9. Similarly, biasing word line 702 appropriately creates a conductive path between source/drain region 732 and a companion source/drain region. The amount of stored charge in body 706 determines the threshold voltage for the transistor that includes word line 701 and source/drain region 731 as well as for the transistor that includes word line 702 and source/drain region 732. The charge can be stored in (programmed) or removed from (erased) body 706 using either word line 701 or word line 702.

Figure 10:
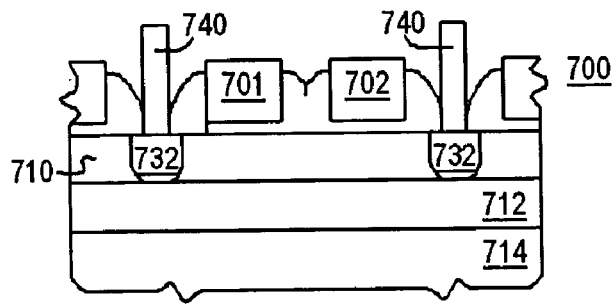
FIG. 10 depicts processing subsequent to FIG. 9 in which contacts to the source/drain regions are formed.

In FIG. 10, contacts 740 are made to source/drain regions 731 and 732. An interconnect (not depicted) may be formed subsequently to connect source/drain regions 731 and 732 appropriately. Referring to the top view of FIG. 4, interconnects to contacts 740 would run parallel to each other and perpendicular to the plane of cross section. Analogous interconnects would contact the non-depicted source/drain region for each transistor. In this configuration, an individual transistor is selected (for programming, erasing, or reading/sensing) by biasing the appropriate word line and source/drain region interconnects.

In the foregoing specification, the invention has been described with reference to specific embodiments. However, one of ordinary skill in the art appreciates that various modifications and changes can be made without departing from the scope of the present invention as set forth in the claims below. For example, although the depicted embodiment is illustrated and described as using NMOS transistors, other embodiments may use PMOS transistors. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A multiport memory cell, comprising:
   a first word line comprising a gate electrode of a first transistor;
   a first bit line pair including a first bit line and a first bit line bar, wherein the first bit line is connected to a first source/drain terminal of the first transistor; and the first bit line bar is connected to a second source/drain terminal of the first transistor;
   a second word line comprising a gate electrode of a second transistor;
   a second bit line pair including a second bit line and a second bit line bar, wherein the second bit line is connected to a first source/drain terminal of the second transistor; and the second bit line bar is connected to a second source/drain terminal of the second transistor; and
   a conductive path between an electrically floating body of the first transistor and an electrically floating body of the second transistor.

2. The memory cell of claim 1, wherein the first word line overlies a first portion of a common body and wherein the second word line overlies a second portion of the common body.

3. The memory cell of claim 1, wherein the common body comprises a semiconductor layer overlying a buried isolation layer.

4. The memory cell of claim 3, wherein the common body is positioned vertically between the buried oxide layer and a gate dielectric layer and wherein the common body is positioned laterally between first and second source/drain regions formed in the semiconductor layer.

5. The memory cell of claim 4, wherein the first bit line contacts the first source/drain region and the first bit line bar contacts the second source/drain region and further wherein the first transistor includes an isolation structure between the first and second source/drain regions.

6. The memory cell of claim 5, wherein the common body portion is laterally adjacent to the isolation structure and the first and second source/drain regions and wherein the first word line overlies the body portion and defines a boundary between the body portion and the source/drain regions.

7. The memory cell of claim 5, wherein the first transistor is configured to form a conductive path from the first source/drain region to the second source/drain region when the first word line is biased ON, and wherein the conductive path circumvents the isolation structure.

8. The memory cell of claim 1, wherein portions of the first and second word lines are separated by a gap and wherein spacers on sidewalls of the first and second word lines cover the gap wherein the spacers prevent an implant performed after formation of the spacers from introducing an impurity into a portion of the body underlying the gap.

9. The memory cell of claim 1, further comprising:
a third word line coupled to a gate electrode of a third transistor; and
a third bit line pair including a third bit line and a third bit line bar, wherein the third bit line is connected to a third source/drain terminal of the third transistor and the third bit line bar is connected to a second source/drain terminal of the third transistor;
wherein the conductive path further comprises an conductive path between the first transistor body and the third transistor body.

10. A multi port memory cell, comprising:
a first transistor including a first gate electrode and a second transistor including a second gate electrode, wherein a portion of the first gate electrode is parallel to a portion of the second gate electrode;
spacer structures on first sidewalls of the first and second gate electrodes wherein the spacer structures have a first width;
a spacer mask spanning a distance between the parallel portions of the first and second gate electrodes, wherein the distance is less than twice the first width; and
a contiguous body portion, shared by the first and second transistors, underlying the first and second gate electrodes.

11. The memory cell of claim 10, further comprising a first bit line pair connected to source/drain regions of the first transistor and an independent second bit line pair connected to source/drain regions of the second transistor.

12. The memory cell of claim 11, wherein the first transistor includes an isolation structure disposed between the source/drain regions of the first transistor.

13. The memory cell of claim 12, wherein the body portion is laterally adjacent to the source/drain regions of the first transistor and to the isolation structure and wherein the first gate electrode overlies the body portion and defines a boundary between the body portion and the first and second source/drain regions.

14. The memory cell of claim 13, wherein a portion of the isolation structure extends under the first gate electrode.

15. The memory cell of claim 10, further comprising third and fourth transistors including third and fourth gate electrodes respectively, wherein a portion of the first gate electrode is parallel to a portion of the third gate electrode, a portion of the third gate electrode is parallel to the fourth electrode, and a portion of the fourth gate electrode is parallel to the second gate electrode.

16. The memory cell of claim 15, further comprising spacer structures on sidewalls of the third and fourth transistors wherein the spacers converge each of the parallel portions and wherein the contiguous body portion is shared by the first, second, third, and fourth transistors.

* * * * *